United States Patent [19]

Delassus et al.

[11] Patent Number: 4,489,218

[45] Date of Patent: Dec. 18, 1984

[54] DEVICE FOR PROTECTING METAL OBJECTS SITUATED IN THE ENVIRONMENT OF AN INTENSE MAGNETIC FIELD DEVELOPED BY AN ALTERNATOR ROTOR WITHOUT A STATOR

[75] Inventors: Jean Delassus, Montmorency; Michel Gey, Houilles; Jean-Claude Comensoli, Gonesse; Paul Pouger, Aulnay sous Bois, all of France

[73] Assignee: Alsthom-Atlantique, Paris, France

[21] Appl. No.: 407,413

[22] Filed: Aug. 12, 1982

[30] Foreign Application Priority Data

Aug. 25, 1981 [FR] France ................. 81 16203

[51] Int. Cl.³ ............................................. H05K 9/00
[52] U.S. Cl. ............................. 174/35 R; 165/80 A; 165/173; 174/15 R; 324/158 MG
[58] Field of Search .......... 174/35 R, 35 SM, 35 MS, 174/15 R; 324/158 MG; 336/84; 165/80 A, 173, 175, 176

[56] References Cited

U.S. PATENT DOCUMENTS

| 230,815 | 8/1880 | Puffer | 165/176 |
| 2,913,577 | 11/1959 | Johnson | 174/35 MS X |
| 3,364,915 | 1/1968 | Zielinski | 165/175 X |

Primary Examiner—John F. Gonzales
Assistant Examiner—D. A. Tone
Attorney, Agent, or Firm—Sughrue, Mion, Zinn, Macpeak, and Seas

[57] ABSTRACT

The protection device comprises two half cages (13, 14) superposed on each other and surrounding the rotor (8) under test. The half cages together constitute a cage with openings between its bars and provided with water cooling in said bars. The cage ensures that the magnetic field generated by a rotor under test with excitation current is stopped within a distance equivalent to the size of the holes between the cage bars. Induced current heating in the cage is kept under control by water cooling, and metal objects outside the cage are substantially protected from the magnetic field by the cage. Air can pass freely through the cage, and the rotor can be observed without removing the cage.

5 Claims, 3 Drawing Figures

DEVICE FOR PROTECTING METAL OBJECTS SITUATED IN THE ENVIRONMENT OF AN INTENSE MAGNETIC FIELD DEVELOPED BY AN ALTERNATOR ROTOR WITHOUT A STATOR

The present invention relates to a device for protecting metal objects situated in the environment of an intense magnetic field developed when an excitation current is passed through a rotor during testing without a stator, the device comprising a metal envelope in several parts surrounding the rotor.

BACKGROUND OF THE INVENTION

When testing the rotor of an alternator, it is convenient to power it with an excitation current to be able to observe its mechanical behavior when it heats up. The tests are carried out in speed testing pits including metal slideways along which the supports of the rotor bearing slide, as do travelling cranes.

When the speed testing pit is capable of being put under vacuum, it also includes a cylindrical steel sheath to which the slideways and the travelling crane are fixed.

Now, when the rotor is made to rotate with excitation current passing through it, a powerful rotating radial magnetic field is produced which induces currents in all the surrounding metal parts (bearing supports, slideways, travelling crane, and steel sheath if there is one). These currents cause local hot spots, which in turn lead to excessive deformation.

German published patent specification DE-A No. 2 945 144 describes a metal shield which completely encloses the rotor and which is in the form of two semi-cylindrical half shields each made up of semi-cylindrical segments of un-perforated metal sheet which are assembled by bolted flanges, with the two half shields being electrically connected along a vertical join plane and having un-perforated metal face plates at both ends.

In said known device, there are considerable electrical losses in the solid shield which cause heating that can lead to the shield being deformed.

Further, the air imprisoned inside the shield heats up when the rotor rotates, and in turn the rotor is heated also, and in the absence of any ventilation it reaches prohibitive temperatures.

Preferred embodiments of the present invention enable these drawbacks to be avoided.

SUMMARY OF THE INVENTION

The present invention provides a device comprising at least one metal cage forming a grid with openings therein, each cage being made up from a lower half cage which is supported on a base and an upper half cage which is placed on the lower half cage, the half cages meeting along a horizontal joint plane, and each half cage comprising horizontal electrically conductive bars extending parallel to the rotor axis and mechanically and electrically joined to electrically conductive semi-circular arcs or rib members, said cage, or said plurality of cages when placed end-to-end, being longer than the portion of the rotor which produces a magnetic field, and said horizontal conductor bars being tubes through which cooling water circulates and the end arc conductors serving as manifolds for inlet and outlet of cooling water.

Cages in accordance with the invention block the magnetic field in such a manner that metal objects placed around the cage at a distance about equal to the gaps in the cage are protected from the magnetic field.

The cooling water prevents the horizontal conductor bars themselves from overheating.

Further, the gaps pass the air which is blown by the rotor rotating, thereby ensuring that the rotor does not overheat.

Furthermore, the rotor can be visually observed through the gaps in the cage, and if necessary, work can be done on the rotor itself during testing without having to remove the cage first.

Finally, since the joint plane between the two half cages is horizontal, their assembly is facilitated, and in particular there is no need for equipment to move the half cages in horizontal directions perpendicular to the rotor axis.

In a preferred embodiment of the invention each of the two half cages making up each cage extends in the joint plane in the form of two flanges. The flanges comprise auxiliary tubes which open out into joint plane extensions of the end manifolds, and which are held in place by joint plane extensions of the rib members. The flanges of the upper half cage are held electrically apart from the flanges of the lower half cage by means of electrical insulators.

Thus the electric currents induced along the joint plane in each half cage are prevented from flowing through the joint plane, thereby avoiding problems of electrical contact between the half cages.

To hold the two half cages tightly together while maintaining their electrical insulation from each other, insulating blocks are disposed between the tubes of the outwardly projecting flanges. The blocks have metal bolts passing therethrough which provide tightening without direct contact with conducting portions of either half cage.

To ensure good cooling of each cage, the water is inserted at the low point of one of the semi-circular manifolds of the lower half cage and is removed from the high point of the other semi-circular manifold, whence it is inserted into the low point of one of the semi-circular manifolds of the upper half cage and is finally removed from the high point of the other upper semi-circular manifold. The connection between the high point of the lower half cage and the low point of the upper half cage should be via a short length of pipe.

To avoid the upper half cage being at an indeterminate potential, the two half cages may be electrically connected via a high value resistance which is incapable of passing large currents due to induction.

BRIEF DESCRIPTION OF THE DRAWINGS

An embodiment of the invention is described by way of example with reference to the accompanying drawings, in which.

MORE DETAILED DESCRIPTION

Figure 1:
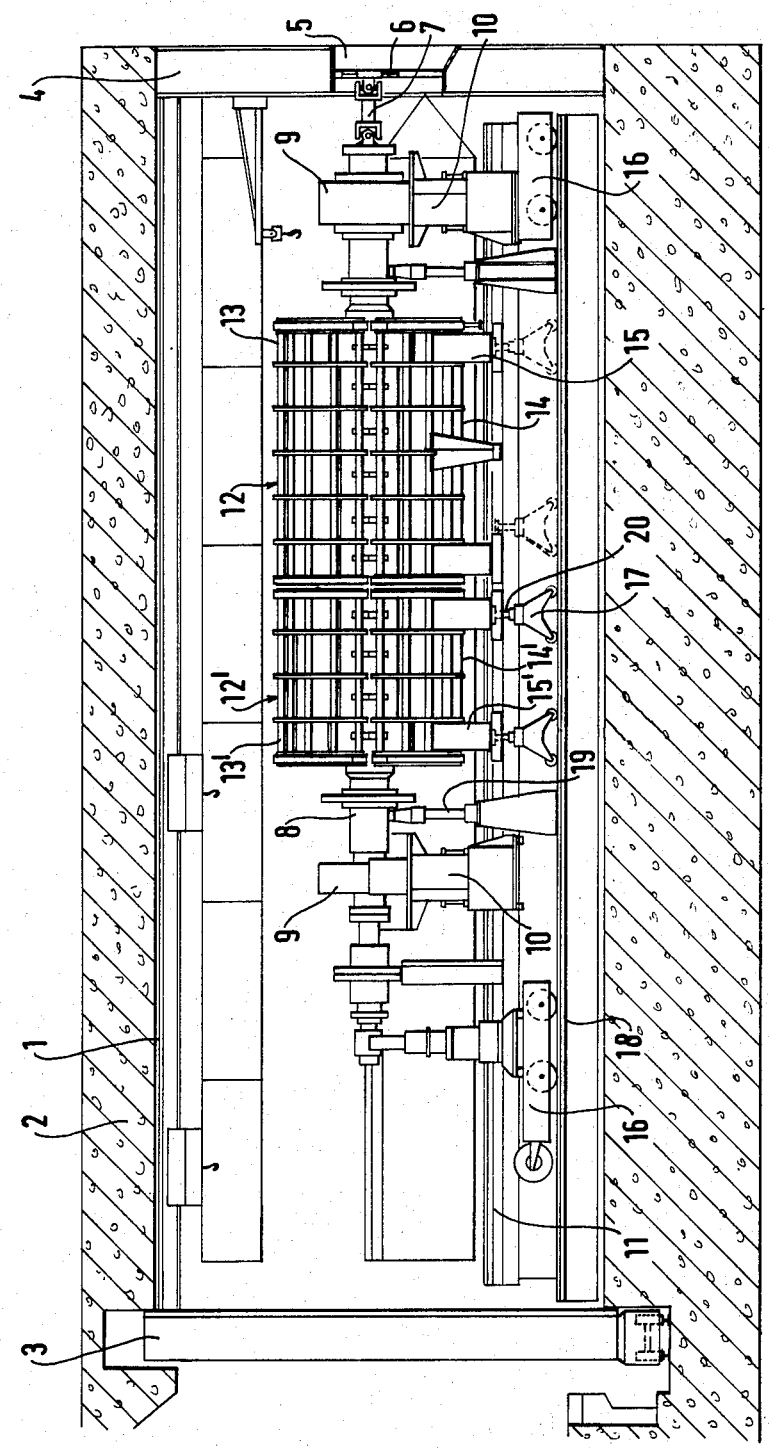
FIG. 1 is a longitudinal section through a speed testing pit capable of being evacuated, and containing a rotor surrounded by a protective cage in accordance with the invention.

The speed testing pit shown in FIG. 1 comprises a horizontal tunnel with a cylindrical steel sheath 1 surrounded by concrete 2. At the left hand end of the tunnel as shown in the figure there is a door 3 capable of hermetically sealing the tunnel.

At the right hand end of the tunnel there is a wall 4 having an opening 5 provided with a sealing ring 6 through which there passes a shaft 7 for driving the rotor 8. The rotor 8 has a shaft which turns in bearings 9 mounted on supports 10, themselves mounted on slideways 11.

The rotor 8 is surrounded by a first cage 12 and by a second cage 12'. The cage 12 comprises an upper half cage 13 and a lower half cage 14, while the cage 12' comprises an upper half cage 13' and a lower half cage 14'.

The lower half cages 14 and 14' are connected to supports 15 and 15' which are mounted in turn on the slideways 11. The supports 10 of the bearings 9 and the supports 15 and 15' of the lower half cages are brought into the tunnel on trollies 16, 17 and are then placed on the slideways.

The trollies 16 run on rails 18 which extend outside the tunnel, for assembly of the equipment comprising the rotor, its bearings and their supports, and the cages with their supports.

The trollies 16 are rolled into the tunnel and the bearing supports 10 are placed on the slideway 11 by means of jacks on the trollies 16. The trollies 17 used for the supports 15 and 15' of the lower half cages likewise include jacks 20 which can be lowered to place the supports 15 and 15' on the slideway 11.

Figure 2:
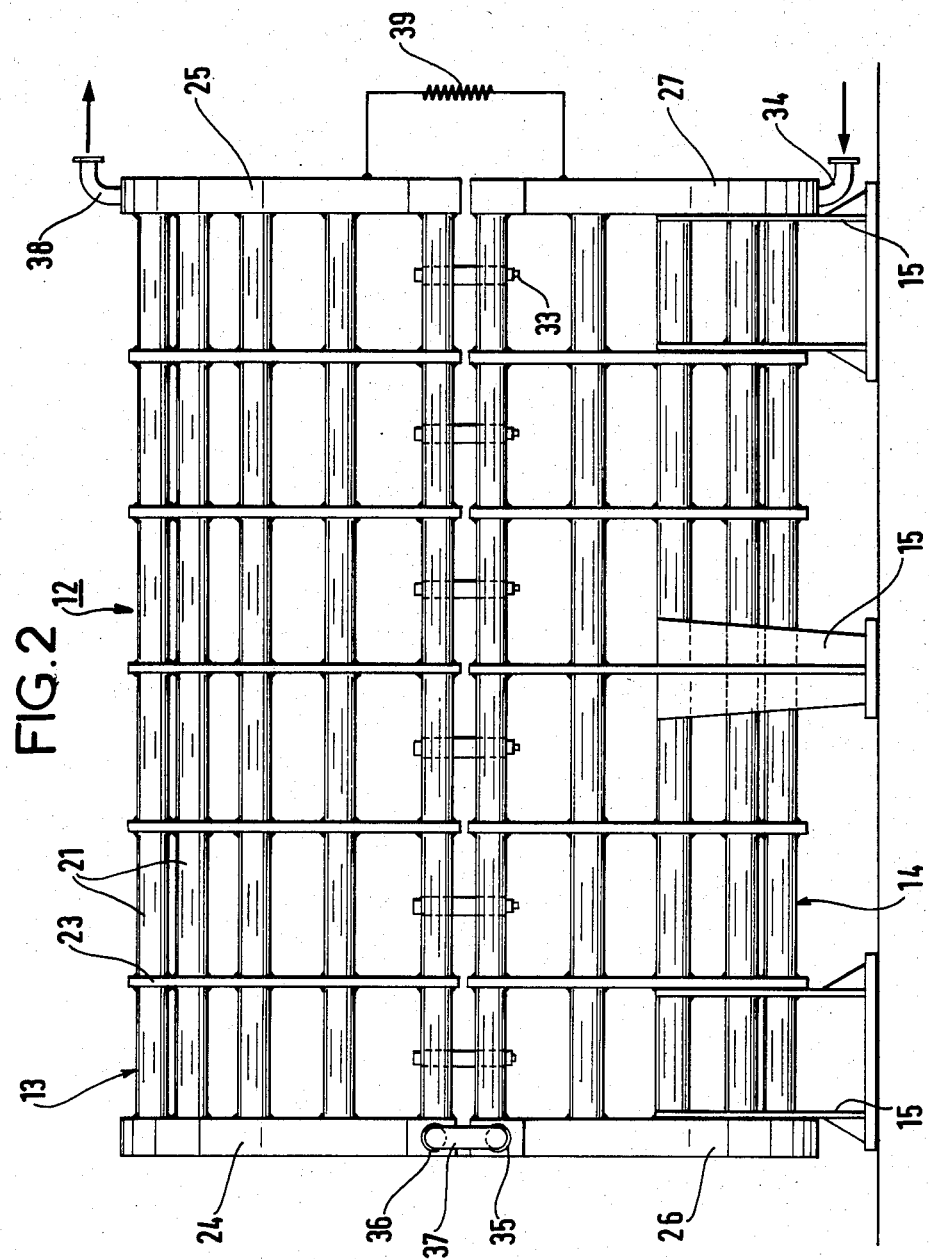
FIG. 2 is a side view of a protective cage in accordance with the invention.
Figure 3:
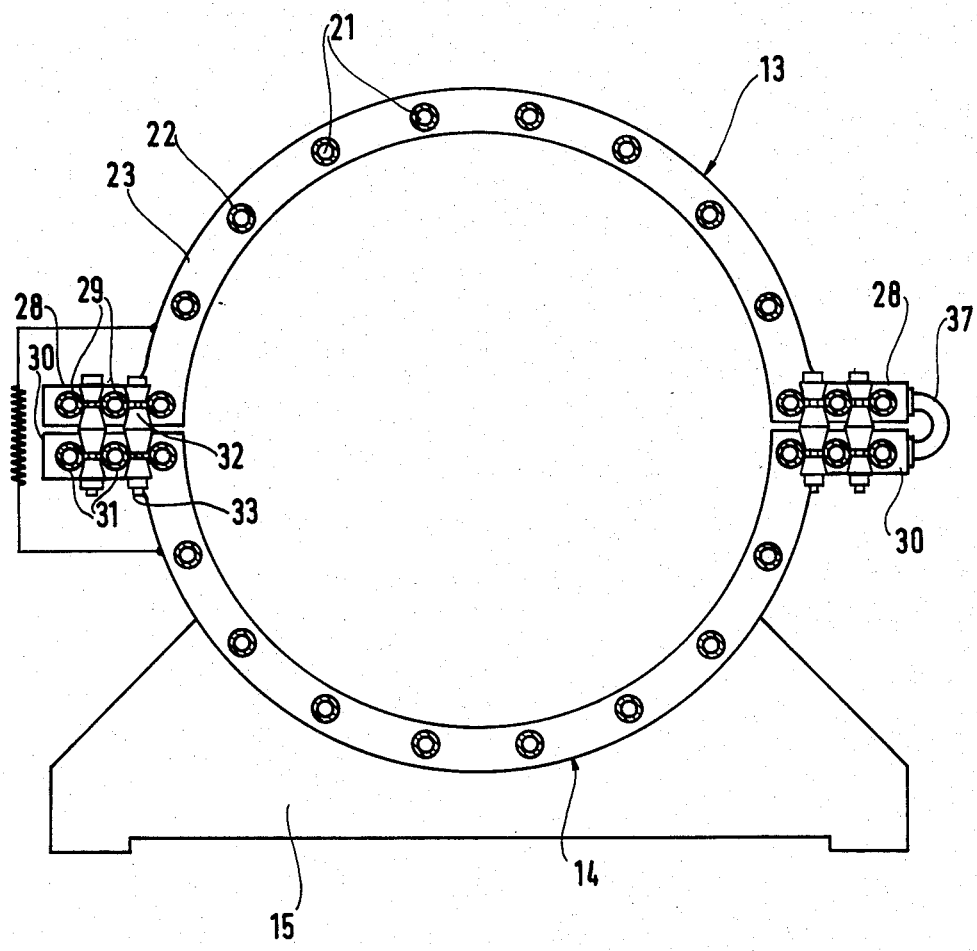
FIG. 3 is a vertical cross section through the cage shown in FIG. 2.

Each half cage (see FIGS. 2 and 3) includes regularly spaced horizontal tubes 21. These tubes pass through holes 22 through semi-circular conductive arcs or rib members 23, and they are welded thereto all the way round the holes. The semi-circular ribs 23 are of thick metal and provide mechanical rigidity for the assembly. At each end of the half cages there are hollow semi-circular arc members (24 and 25 for the upper half cage and 26 and 27 for the lower half cage) into which the horizontal tubes open out, said hollow arc members serving as manifolds for circulating a cooling liquid through the horizontal tubes.

In its horizontal joint plane, the upper half cage 13 has two horizontal projections or flanges 28. Each of these flanges comprises two horizontal auxiliary tubes 29.

Likewise, in its horizontal joint plane, the lower half cage 14 includes two horizontal projections or flanges 30 each comprising two horizontal auxiliary tubes 31.

The auxiliary tubes 29 and 31 are held in place by horizontal extensions i.e. upper and lower flanges 28 and 30, respectively, of the semi-circular ribs 23, and they open out into horizontal extensions of the end manifolds (24 and 25 for the upper half cage, 26 and 27 for the lower half cage).

Trapezoidal insulating wedges 32 are jammed between the tubes making up the horizontal flanges 28 and 30 of the two half cages 13 and 14; i.e. between the pairs of auxiliary tubes 29 or 31 and between the inside auxiliary tubes and the adjacent tube 21 in the cylindrical portion of the cage. The wedges of the upper half cage stand on the corresponding wedges of the lower half cage in such a manner that there is no electrical contact between the upper and lower flanges 28 and 30.

The tubes of the upper flanges 28 are placed vertically above the tubes of the lower flanges 30 to provide good magnetic coupling between the flanges.

Metal bolts 33 pass through corresponding pairs of wedges 32 and serve to hold the upper and lower half cages together without causing electrical contact therebetween.

Cooling water arrives via an inlet 34 to the bottom of the right hand (in FIG. 2) manifold 27 of the lower half cage 14, and leaves the lower half cage via an outlet 35 at the top of the left hand manifold 26. The outlet 35 is connected to an inlet 36 at the bottom of the left hand manifold 24 of the upper half cage 13 by means of a flexible length of pipe 37. The water finally leaves via an outlet 38 at the top of the right hand manifold 25 of the upper half cage 13.

To ensure that the upper half cage 13 remains at a fixed potential, it is connected to the lower half cage 14 via an electrical connection of very high resistance 39.

Because of its very high resistance, this connection does not transmit vaiable currents that may be induced in the upper half cage 13.

To test the rotor 8, the pit is closed, and the rotor is then made to rotate. The resulting rotating magnetic field is intercepted by the cages 12, 12', and for rectangular gaps in the cage that are 1 m long (the distance between two ribs 23) by 40 cm wide (the distance between two tubes 21), the magnetic field at 50 cm outside the cage is reduced to an acceptable level.

The conductors 21 are made of an alloy that is a good conductor of electricity and the heat generated by the Joule effect is removed by the cooling water.

The flux leakage between the facing flanges 28 and 30 of the two half cages 13 and 14 is very low by virtue of their proximity to one another. Further, the flux that does leak out between the flanges 28 and 30 spreads out, loosing concentration and produces no ill effects.

The flux induces two layers of current flowing in opposite directions in the facing flanges 28 and 30, but since the loss of magnetic potential along join plane (V to O) is the same only when following a quarter circumference to the vertical diameter, the result is that the sum of the currents induced in one flange 28 is equal and opposite to the sum of the currents induced in the adjacent quarter circumference, which ensures that the currents loop without passing through the joint plane.

In the FIG. 1 example, there is a short cage 12' and a long cage 12. The two cages 12 and 12' are placed end to end so that their total length is slightly longer than the rotor 8 generating the field. Thus the entire surrounding metal environment of the rotor, and in particular the bearing supports 10 and the slideway 11 are protected.

We claim:

1. A device for protecting metal objects situated in the environment of an intense magnetic field as developed by an alternator rotor with an excitation current passing therethrough during testing without a stator, the device comprising a multi part metal covering for surrounding the rotor, said covering comprising at least one cylindrical metal cage forming a cylindrical grid with openings therein, each said at least one cage comprising a lower half cage supported on a base and an upper half cage placed on the lower half cage, the half cages meeting along a horizontal joint plane, and each half cage comprising horizontal electrically conductive bars extending parallel to the rotor axis and mechanically and electrically joined to electrically conductive semi-circular rib members, said rib members including hollow end rib members at respective ends of said at least one cage, said at least one cage being longer than the portion of the rotor which produces a magnetic field, and said horizontal conductor bars being tubes.

and means for circulating cooling water through said tubes, the wherein said hollow end rib members constitute inlet and outlet end manifolds for the cooling water.

2. A protection device according to claim 1, wherein the half cages constituting each cage project in the joint plane in the form of two longitudinally extending, outwardly projecting flanges each comprising auxiliary tubes opening out into extensions of the end manifolds and being held in place by outwardly projecting extensions of the electrically conductive rib members, the flanges of the upper half cage being connected to the flanges of the lower half cage by electrically insulating means.

3. A protection device according to claim 2, wherein the upper and lower half cages are tightened together by bolts passing through said insulating means, whereby no electrical contact is made between the upper and lower halves by the means holding the halves together.

4. A protection device according to claim 1, wherein an inlet pipe opens to the low point of one of the end manifolds of the lower half cage, and an outlet pipe opens to the high point of one of the end manifolds of the upper half cage, and wherein pipes connect the high point of the other end manifold of the lower half cage to the low point of the other end manifold of said upper half cage; whereby cooling water can circulate through the lower half cage and then through the upper half cage between the inlet pipe and the outlet pipe.

5. A protection device according to claim 1, wherein a very high resistance electrical connection is provided between the two half cages, thereby enabling the upper cage to be maintained substantially at earth potential.

* * * * *